United States Patent
Ugolini et al.

(10) Patent No.: US 11,658,630 B2
(45) Date of Patent: May 23, 2023

(54) SINGLE SERVO LOOP CONTROLLING AN AUTOMATIC GAIN CONTROL AND CURRENT SOURCING MECHANISM

(71) Applicant: MACOM Technology Solutions Holdings, Inc., Lowell, MA (US)

(72) Inventors: Jonathan Ugolini, Sophia-Antipolis (FR); Wim Cops, Le Rouret (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 174 days.

(21) Appl. No.: 17/111,884

(22) Filed: Dec. 4, 2020

(65) Prior Publication Data

US 2022/0182031 A1    Jun. 9, 2022

(51) Int. Cl.
*H03G 3/30* (2006.01)
*H03F 1/08* (2006.01)
*H01L 31/02* (2006.01)

(52) U.S. Cl.
CPC ..... *H03G 3/3084* (2013.01); *H01L 31/02016* (2013.01); *H03F 1/086* (2013.01); *H03F 2200/129* (2013.01)

(58) Field of Classification Search
CPC .... H03G 3/3084; H03G 1/0088; H03F 1/086; H03F 3/08; H03F 2200/129; H01L 31/02016
(Continued)

(56) References Cited

U.S. PATENT DOCUMENTS 4,236,256 A    11/1980 Brackett
4,297,527 A    10/1981 Pate
(Continued)

FOREIGN PATENT DOCUMENTS

EP    0606161    4/2000
EP    1471671    12/2004
(Continued)

OTHER PUBLICATIONS

"An Introduction to DVD Recordable (DVD-R) What is DVD Recordable?" http://www.dvd-copy.com/reference/dvd_recordable.html, 2004, 8 pages.
"An Introduction to DVD-RW", DVD White Paper, Pioneer New Media Technologies, Inc., Feb. 8, 2001, 8 pages.
(Continued)

*Primary Examiner* — Hafizur Rahman
*Assistant Examiner* — Khiem D Nguyen
(74) *Attorney, Agent, or Firm* — Weide & Miller, Ltd.

(57) ABSTRACT

A single servo control loop for amplifier gain control based on signal power change over time or system to system, having an amplifier configured to receive an input signal on an amplifier input and generate an amplified signal on an amplifier output. The differential signal generator processes the amplified signal to generate differential output signals. The single servo control loop processes the differential output signal to generates one or more gain control signals and one or more current sink control signals. A gain control system receives a gain control signal and, responsive thereto, controls a gain of one or more amplifiers. A current sink receives a current sink control signal and, responsive thereto, draws current away from the amplifier input. Changes in input power ranges generate changes in the integration level of the differential signal outputs which are detected by the control loop, and responsive thereto, the control loop dynamically adjusts the control signals.

18 Claims, 6 Drawing Sheets

(58) Field of Classification Search
USPC .......................................... 330/282, 252–261
See application file for complete search history.

(56) References Cited

U.S. PATENT DOCUMENTS

| | | |
|---|---|---|
| 4,415,803 A | 11/1983 | Muoi |
| 4,488,305 A | 12/1984 | Claverie |
| 4,534,064 A | 8/1985 | Giacometti et al. |
| 4,545,076 A | 10/1985 | Biard |
| 4,545,078 A | 10/1985 | Wiedeburg |
| 4,574,249 A | 3/1986 | Williams |
| 4,687,937 A | 8/1987 | Aagano et al. |
| 4,709,416 A | 11/1987 | Patterson |
| 4,719,643 A | 1/1988 | Beeman |
| 4,734,914 A | 3/1988 | Yoshikawa |
| 4,747,091 A | 5/1988 | Doi |
| 4,805,236 A | 2/1989 | Urala |
| 4,859,964 A | 8/1989 | Jorgensen |
| 4,864,649 A | 9/1989 | Tajima et al. |
| 4,947,425 A | 8/1990 | Grizmala et al. |
| 5,019,769 A | 5/1991 | Levinson |
| 5,039,194 A | 8/1991 | Block et al. |
| 5,057,932 A | 10/1991 | Lang |
| 5,210,712 A | 5/1993 | Saito |
| 5,293,405 A | 3/1994 | Gersbach et al. |
| 5,321,849 A | 6/1994 | Lemson |
| 5,334,826 A | 8/1994 | Sato et al. |
| 5,383,046 A | 1/1995 | Tomofuji et al. |
| 5,383,208 A | 1/1995 | Queniat et al. |
| 5,392,273 A | 2/1995 | Masaki et al. |
| 5,394,416 A | 2/1995 | Ries |
| 5,396,059 A | 3/1995 | Yeates |
| RE34,972 E | 6/1995 | Horiguchi et al. |
| 5,448,629 A | 9/1995 | Bosch et al. |
| 5,471,501 A | 11/1995 | Parr et al. |
| 5,488,627 A | 1/1996 | Hardin et al. |
| 5,491,548 A | 2/1996 | Bell et al. |
| 5,510,924 A | 4/1996 | Terui et al. |
| 5,532,471 A | 7/1996 | Khorramabadi et al. |
| 5,557,437 A | 9/1996 | Sakai et al. |
| 5,570,217 A | 10/1996 | Fleuren |
| 5,574,435 A | 11/1996 | Mochizuki et al. |
| 5,594,748 A | 1/1997 | Jabr |
| 5,603,114 A | 2/1997 | Tomita |
| 5,621,518 A | 4/1997 | Beller |
| 5,636,254 A | 6/1997 | Hase et al. |
| RE35,607 E | 9/1997 | Nagamune et al. |
| 5,673,282 A | 9/1997 | Wurst |
| 5,678,198 A | 10/1997 | Lemson |
| 5,699,402 A | 12/1997 | Bauer et al. |
| 5,710,660 A | 1/1998 | Yamamoto et al. |
| 5,812,572 A | 9/1998 | King et al. |
| 5,822,099 A | 10/1998 | Takamatsu |
| 5,831,959 A | 11/1998 | Sakanushi |
| 5,844,928 A | 12/1998 | Shastri et al. |
| 5,872,468 A | 2/1999 | Dyke |
| 5,884,231 A | 3/1999 | Perdue et al. |
| 5,889,605 A | 3/1999 | Claverie |
| 5,892,220 A | 4/1999 | Woodward |
| 5,900,959 A | 5/1999 | Noda et al. |
| 5,912,694 A | 6/1999 | Miyake |
| 5,926,303 A | 7/1999 | Giebel et al. |
| 5,943,152 A | 8/1999 | Mizrahi et al. |
| 5,953,690 A | 9/1999 | Lemon |
| 5,956,168 A | 9/1999 | Levinson et al. |
| 5,963,901 A | 10/1999 | Vahatalo et al. |
| 5,978,393 A | 11/1999 | Feldman et al. |
| 6,005,240 A | 12/1999 | Krishnamoorthy |
| 6,010,538 A | 1/2000 | Sun et al. |
| 6,014,241 A | 1/2000 | Winter et al. |
| 6,020,593 A | 2/2000 | Chow et al. |
| 6,021,947 A | 2/2000 | Swartz |
| 6,023,147 A | 2/2000 | Cargin, Jr. et al. |
| 6,028,661 A | 2/2000 | Minami et al. |
| 6,049,413 A | 4/2000 | Taylor et al. |
| 6,064,501 A | 5/2000 | Roberts et al. |
| 6,075,628 A | 6/2000 | Fisher et al. |
| 6,081,362 A | 6/2000 | Hatakeyama |
| 6,108,113 A | 8/2000 | Fee |
| 6,111,687 A | 8/2000 | Tammela |
| 6,115,113 A | 9/2000 | Flockencier |
| H1881 H | 10/2000 | Davis et al. |
| 6,160,647 A | 12/2000 | Gilliland et al. |
| 6,175,434 B1 | 1/2001 | Feng |
| 6,215,514 B1 | 4/2001 | Harris |
| 6,259,293 B1 | 7/2001 | Hayase et al. |
| 6,262,781 B1 | 7/2001 | Deter |
| 6,282,017 B1 | 8/2001 | Kinoshita |
| 6,292,497 B1 | 9/2001 | Nakano |
| 6,317,062 B1 | 11/2001 | Payer et al. |
| 6,333,895 B1 | 12/2001 | Hamamoto et al. |
| 6,341,360 B1 | 1/2002 | Abdelilah et al. |
| 6,366,373 B1 | 4/2002 | MacKinnon et al. |
| 6,397,090 B1 | 5/2002 | Cho |
| 6,423,963 B1 | 7/2002 | Wu |
| 6,445,662 B1 | 9/2002 | Tonami |
| 6,445,732 B1 | 9/2002 | Beamish |
| 6,452,719 B2 | 9/2002 | Kinoshita |
| 6,473,224 B2 | 10/2002 | Dugan et al. |
| 6,494,370 B1 | 12/2002 | Sanchez |
| 6,504,857 B1 | 1/2003 | Iwazaki |
| 6,512,610 B1 | 1/2003 | Minami et al. |
| 6,512,617 B1 | 1/2003 | Tanji et al. |
| 6,534,997 B1 | 3/2003 | Horishita et al. |
| 6,535,187 B1 | 3/2003 | Wood |
| 6,542,228 B1 | 4/2003 | Hartog |
| 6,547,453 B1 | 4/2003 | Stummer et al. |
| 6,556,601 B2 | 4/2003 | Nagata |
| 6,563,848 B1 | 5/2003 | Iwazaki |
| 6,570,944 B2 | 5/2003 | Best et al. |
| 6,580,328 B2 | 6/2003 | Tan et al. |
| 6,593,810 B2 | 7/2003 | Yoon |
| 6,597,485 B1 | 7/2003 | Ikeuchi |
| 6,624,405 B1 | 9/2003 | Lau et al. |
| 6,657,488 B1 | 12/2003 | King et al. |
| 6,661,940 B2 | 12/2003 | Kim |
| 6,704,008 B2 | 3/2004 | Naito et al. |
| 6,707,492 B1 | 3/2004 | Itani |
| 6,707,600 B1 | 3/2004 | Dijaili et al. |
| 6,720,826 B2 | 4/2004 | Yoon |
| 6,731,161 B1 | 5/2004 | O'Leary |
| 6,737,924 B1 | 5/2004 | Paillet |
| 6,740,864 B1 | 5/2004 | Dries |
| 6,801,555 B1 | 10/2004 | Dijaili et al. |
| 6,828,857 B2 | 12/2004 | Paillet et al. |
| 6,836,493 B2 | 12/2004 | Mahowald et al. |
| 6,837,625 B2 | 1/2005 | Schott et al. |
| 6,852,966 B1 | 2/2005 | Douma et al. |
| 6,862,047 B2 | 3/2005 | Hibi |
| 6,864,751 B1 | 3/2005 | Schmidt et al. |
| 6,868,104 B2 | 3/2005 | Stewart et al. |
| 6,873,279 B2 | 3/2005 | Jones et al. |
| 6,879,217 B2 | 4/2005 | Visocchi |
| 6,885,954 B2 | 4/2005 | Jones et al. |
| 6,888,123 B2 | 5/2005 | Douma et al. |
| 6,909,731 B2 | 6/2005 | Lu |
| 6,915,076 B1 | 7/2005 | Mittal |
| 6,934,307 B2 | 8/2005 | DeCusatis et al. |
| 6,934,479 B2 | 8/2005 | Sakamoto et al. |
| 6,941,077 B2 | 9/2005 | Aronson et al. |
| 6,952,531 B2 | 10/2005 | Aronson et al. |
| 6,956,643 B2 | 10/2005 | Farr et al. |
| 6,957,021 B2 | 10/2005 | Aronson et al. |
| 6,967,320 B2 | 11/2005 | Chieng et al. |
| 7,005,901 B1 | 2/2006 | Jiang et al. |
| 7,031,574 B2 | 4/2006 | Huang et al. |
| 7,039,082 B2 | 5/2006 | Stewart et al. |
| 7,046,721 B2 | 5/2006 | Grohn |
| 7,049,759 B2 | 5/2006 | Roach |
| 7,050,720 B2 | 5/2006 | Aronson et al. |
| 7,058,310 B2 | 6/2006 | Aronson et al. |
| 7,065,114 B2 | 6/2006 | Hishiyama |
| 7,066,746 B1 | 6/2006 | Togami et al. |
| 7,079,775 B2 | 7/2006 | Aronson et al. |

(56) References Cited

U.S. PATENT DOCUMENTS

| | | |
|---|---|---|
| 7,106,769 B2 | 9/2006 | Fairgrieve |
| 7,127,391 B2 | 10/2006 | Chang |
| 7,181,100 B2 | 2/2007 | Douma et al. |
| 7,184,671 B2 | 2/2007 | Wang |
| 7,193,957 B2 | 3/2007 | Masui et al. |
| 7,206,023 B2 | 4/2007 | Belliveau |
| 7,215,891 B1 | 5/2007 | Chiang et al. |
| 7,227,916 B2 | 6/2007 | Ruelke et al. |
| 7,233,206 B2 | 6/2007 | Murakami et al. |
| 7,236,108 B2 | 6/2007 | Cheng |
| 7,265,334 B2 | 9/2007 | Draper et al. |
| 7,269,194 B2 | 9/2007 | Diaz et al. |
| 7,276,682 B2 | 10/2007 | Draper et al. |
| 7,357,513 B2 | 4/2008 | Watson et al. |
| 7,381,935 B2 | 6/2008 | Sada et al. |
| 7,400,662 B2 | 7/2008 | Robinson |
| 7,403,064 B2 | 7/2008 | Chou et al. |
| 7,453,475 B2 | 11/2008 | Nitta et al. |
| 7,456,690 B2 | 11/2008 | Kocaman |
| 7,474,720 B2 | 1/2009 | Yuuki et al. |
| 7,502,400 B2 | 3/2009 | Preisach |
| 7,504,610 B2 | 3/2009 | Draper |
| 7,505,498 B2 | 3/2009 | Sanchez |
| 7,536,114 B2 | 5/2009 | Gieseler |
| 7,616,700 B2 | 11/2009 | Kim |
| 7,684,531 B2 | 3/2010 | Masui et al. |
| 7,701,833 B2 | 4/2010 | Kim |
| 7,734,309 B2 | 6/2010 | Chi et al. |
| 7,738,602 B2 | 6/2010 | Langenbach |
| 7,741,908 B2 | 6/2010 | Furuta |
| 7,778,294 B2 | 8/2010 | Nishimura et al. |
| 7,949,025 B2 | 5/2011 | Olea |
| 7,978,007 B2 | 7/2011 | Tiiliharju |
| 7,978,985 B2 | 7/2011 | Zheng |
| 8,005,372 B2 | 8/2011 | Takahara |
| 8,059,020 B2 | 11/2011 | Schatzberger |
| 8,094,692 B2 | 1/2012 | Nakamura |
| 8,200,100 B2 | 6/2012 | De Langen |
| 8,260,155 B2 | 9/2012 | Inoue |
| 8,548,110 B2 | 10/2013 | Lin et al. |
| 8,548,336 B2 | 10/2013 | Nuttgens |
| 8,571,079 B1 | 10/2013 | Nguyen |
| 8,754,711 B2 | 6/2014 | Welch |
| 8,872,487 B2 | 10/2014 | Belloni |
| 8,958,512 B1 | 2/2015 | Ding |
| 8,970,300 B2 * | 3/2015 | Piepenstock ........ H03F 3/45497 330/307 |
| 9,232,902 B2 | 1/2016 | Takahashi |
| 9,246,450 B2 | 1/2016 | Schacht et al. |
| 9,419,410 B2 | 8/2016 | Usuki |
| 9,853,735 B1 | 12/2017 | Lin |
| 10,097,147 B2 | 10/2018 | Lin |
| 10,641,823 B2 | 5/2020 | Lu et al. |
| 2001/0046243 A1 | 11/2001 | Schie |
| 2002/0015305 A1 | 2/2002 | Bornhorst et al. |
| 2002/0064193 A1 | 5/2002 | Diaz |
| 2002/0085600 A1 | 7/2002 | Jung |
| 2002/0105982 A1 | 8/2002 | Chin et al. |
| 2002/0114383 A1 | 8/2002 | Belge et al. |
| 2002/0130977 A1 | 9/2002 | Hibi |
| 2002/0140378 A1 | 10/2002 | Volk et al. |
| 2002/0153949 A1 | 10/2002 | Yoon |
| 2002/0181533 A1 | 12/2002 | Vail |
| 2003/0030756 A1 | 2/2003 | Kane et al. |
| 2003/0043869 A1 | 3/2003 | Vaughan |
| 2003/0053003 A1 | 3/2003 | Nishi et al. |
| 2003/0067662 A1 | 4/2003 | Brewer |
| 2003/0122057 A1 | 7/2003 | Han et al. |
| 2003/0165168 A1 | 9/2003 | Murata |
| 2004/0032890 A1 | 2/2004 | Murata |
| 2004/0047635 A1 | 3/2004 | Aronson et al. |
| 2004/0095976 A1 | 5/2004 | Bowler et al. |
| 2004/0114650 A1 | 6/2004 | Tanaka |
| 2004/0136727 A1 | 7/2004 | Androni et al. |
| 2004/0160996 A1 | 8/2004 | Giorgi |
| 2004/0188717 A1 | 9/2004 | Ono |
| 2004/0202215 A1 | 10/2004 | Fairgrieve |
| 2004/0240041 A1 | 12/2004 | Tian |
| 2004/0258115 A1 | 12/2004 | Murata |
| 2005/0024142 A1 | 2/2005 | Sowlati |
| 2005/0062530 A1 | 3/2005 | Bardsley |
| 2005/0105574 A1 | 5/2005 | Wu et al. |
| 2005/0168319 A1 | 8/2005 | Bhattacharya et al. |
| 2005/0180280 A1 | 8/2005 | Hoshino |
| 2005/0185149 A1 | 8/2005 | Lurkens et al. |
| 2005/0215090 A1 | 9/2005 | Harwood |
| 2005/0243879 A1 | 11/2005 | Horiuchi |
| 2005/0244167 A1 | 11/2005 | Liew |
| 2006/0067712 A1 | 3/2006 | Draper |
| 2006/0098699 A1 | 5/2006 | Sanchez |
| 2006/0114954 A1 | 6/2006 | Wong et al. |
| 2006/0125557 A1 | 6/2006 | Manstretta |
| 2006/0126683 A1 | 6/2006 | Kang |
| 2006/0153256 A1 | 7/2006 | Sanchez |
| 2006/0165139 A1 | 7/2006 | Sanchez |
| 2006/0192899 A1 | 8/2006 | Ogita |
| 2006/0239308 A1 | 10/2006 | Husain |
| 2006/0261893 A1 | 11/2006 | Chiang et al. |
| 2006/0278813 A1 | 12/2006 | Iesaka |
| 2006/0280211 A1 | 12/2006 | Garez |
| 2007/0047602 A1 | 3/2007 | Tanaka |
| 2007/0058089 A1 | 3/2007 | Wang |
| 2007/0081130 A1 | 4/2007 | May et al. |
| 2007/0098026 A1 | 5/2007 | Uesaka et al. |
| 2007/0098416 A1 | 5/2007 | Nogami |
| 2007/0159434 A1 | 7/2007 | Yen et al. |
| 2007/0195208 A1 | 8/2007 | Miyazawa et al. |
| 2007/0229718 A1 | 10/2007 | Hall |
| 2007/0263685 A1 | 11/2007 | Takasou |
| 2007/0286609 A1 | 12/2007 | Ikram et al. |
| 2007/0286611 A1 | 12/2007 | Weber |
| 2008/0012508 A1 | 1/2008 | Steele et al. |
| 2008/0024469 A1 | 1/2008 | Damera-Venkata et al. |
| 2008/0055005 A1 | 3/2008 | Nam et al. |
| 2008/0074562 A1 | 3/2008 | Endo et al. |
| 2008/0112711 A1 | 5/2008 | Inoue |
| 2008/0112712 A1 | 5/2008 | Inoue |
| 2008/0205907 A1 | 8/2008 | Kim |
| 2008/0231209 A1 | 9/2008 | Shiwaya et al. |
| 2008/0246893 A1 | 10/2008 | Boss et al. |
| 2008/0303499 A1 | 12/2008 | Chen et al. |
| 2008/0309407 A1 | 12/2008 | Nakamura et al. |
| 2009/0110409 A1 | 4/2009 | Zou et al. |
| 2009/0148094 A1 | 6/2009 | Kucharski et al. |
| 2009/0238226 A1 | 9/2009 | Moto |
| 2010/0027611 A1 | 2/2010 | Dai |
| 2010/0105574 A1 | 4/2010 | Hansford et al. |
| 2010/0164396 A1 | 7/2010 | Lindeberg et al. |
| 2010/0172384 A1 | 7/2010 | Groepl |
| 2010/0183318 A1 | 7/2010 | Tanaka |
| 2011/0062874 A1 | 3/2011 | Knapp |
| 2011/0316632 A1 | 12/2011 | Takemoto |
| 2012/0201260 A1 | 8/2012 | Nguyen et al. |
| 2012/0213531 A1 | 8/2012 | Nazarathy |
| 2014/0023374 A1 | 1/2014 | Yuda |
| 2014/0063593 A1 | 3/2014 | Berendt |
| 2014/0226147 A1 | 8/2014 | Metzler |
| 2014/0233594 A1 | 8/2014 | Kubo |
| 2014/0320212 A1 | 10/2014 | Kalantari et al. |
| 2015/0263625 A1 | 9/2015 | Kanezawa |
| 2016/0070123 A1 | 3/2016 | Tatsumi |
| 2016/0072462 A1 | 3/2016 | Itabashi et al. |
| 2016/0134081 A1 | 5/2016 | Louderback |
| 2017/0085057 A1 | 3/2017 | Barnes |
| 2017/0288369 A1 | 10/2017 | Ikram et al. |
| 2018/0262373 A1 | 9/2018 | Shibasaki |
| 2020/0162169 A1 | 5/2020 | Papanikolaou |

FOREIGN PATENT DOCUMENTS

| | | |
|---|---|---|
| JP | 5-152660 | 6/1993 |
| JP | 2001-119250 | 4/2001 |
| JP | 2004-045989 | 2/2004 |
| WO | WO 93/21706 | 10/1993 |

(56) References Cited

FOREIGN PATENT DOCUMENTS

| WO | WO 02/063800 | 8/2002 |
|---|---|---|
| WO | WO 2004/098100 | 11/2004 |
| WO | WO 2019/015325 | 1/2019 |

OTHER PUBLICATIONS

"CD Basics: The Bumps", Howstuffworks "How CD Burners Work", http://entertainment.howstuffworks.com/cd-burner1.htm, 2004, 3 pages.
"Linear Technology LCT 3533 2A Wide Input Voltage Synchronous Buck-Boost DC/DC Converter", © Linear Technology Corporation 2007, 16 pages.
"National Semiconductor LM 3549 High Power Sequential LED Driver", © 2010 National Semiconductor Corporation, www.national.com, Aug. 3, 2010, 20 pages.
"TPS63020 TPS63021 High Efficiency Single Inductor Buck-Boost Converter With 4-A Switches", Texas Instruments, Copyright © 2010, Texas Instruments Incorporated, Apr. 2010, 28 pages.
"Current mirror" Wikipedia, the free encyclopedia, http://en.wikipedia.org/wiki/Current_mirror, May 22, 2011, 8 pages.
"LCT3454-1A Synchronous Buck-Boost High Current LED Driver" Linear Technology, http://www.linear.com/product/LTC3454 @Linear Technology, 12 pages.
"Power Management, LED-driver considerations" Analog and Mixed-Signal Products, Analog Applications Journal, www.ti.com/sc/analogapps, Texas Instruments Incorporated, © 2005 Texas Instruments Incorporated, Michael Day, 5 pages.
A Low Noise, Wide Dynamic Range, Transimpedance Amplifier with Automatic Gain Control for SDH/SONET (STM16/OC48) in a 30GHz ft BiCMOS Process, Mihai A. T., Sanduleanu, Philips Research Eindhoven, Paul Manteman, Philips Semiconductors Nijmegen, date unknown.
Dr. John Rilum, "Mastering Beyond DVD Density", http://www.optical-disc.com/beyonddvd.html, 2002, 7 pages.
Garth Nash, "AN535 Application Notes—Phase-Locked Loop Design Fundamentals", Motorola, Inc., 1994, 3 pages.
Jaime Bailey "How DVD Works", http://sweb.uky.edu/~jrbai101/dvd.htm, May 1999, 6 pages.
Keith Szolusha, "Linear Technology Design Notes DC/DC Converter Drives Lumileds White LEDs from a Variety of Power Sources-Design Note 340", Linear Technology Corporation, © Linear Technology Corporation 2004, date unknown, 2 pages.
Kim, "Dual Output Transimpedance Amplifier of Cost Effective CMOS Optical Receiver for Digital Audio Interfaces" Circuits and Systems, 2007. ISCAS 2007. IEEE International Sympoyum.
Miller Effect—Wikipedia, the free encyclopedia, http://en.wikipedia.org/wiki/Miller_effect, Mar. 9, 2015.
P.M. Crespo Bofil, G. Shing Liu, C. Ho Wei. Combine baud-rate timing recovery and adaptive equalization for high rate data transmission in digital subscriber lines. In Comunicaciones de Telefonica y Desarrollo, vol. 41, No. 7, Jun. 1993. http://www.tid.es/presencia/publicaciones/comsid/esp/articulos/vol41/combi/combi.html.
Richard Wilkinson "Topic: Selecting the Right DVD Mastering Technique", DVD Technology Update, http://www.optical-disc.com/dvdupdate.html, 2002, 8 pages.
Ron Bertrand, "The Basics of PLL Frequency Synthesis", Online Radio & Electronics Course, Apr. 2002, 9 pages.
Single-Ended vs. Differential Methods of Driving a Laser Diode, Maxim Integrated™, Application Note: HFAN-2.5.0, Rev. 5; Oct. 2008, 5 pages.
Tuan "Solace" Nguyen, "CD, CD-R, CD-RW, DVD, DD-RAM, DVD-RW, and MO", Tweak3D.Net—Your Freakin' Tweakin Source!, http://www.tweak3d.net/articles/opticals/, May 13, 2000, 7 pages.

* cited by examiner

SINGLE SERVO LOOP CONTROLLING AN AUTOMATIC GAIN CONTROL AND CURRENT SOURCING MECHANISM

1. FIELD OF THE INVENTION

The innovation relates to amplifier output signal control and in particular to a method to control amplifier output using a single control loop with an AGC and current sourcing system that maintains low signal distortion and reasonable DC operating conditions.

2. RELATED ART

Amplifiers, such as transimpedance amplifiers ("TIA"), are a commonly utilized electrical component and are used to convert an input current into an amplified output voltage. In optic systems, a TIA will be presented with the output of a photodiode. Due to numerous variables, the optic signal presented to the photodiode will vary in power level. Thus, a major challenge for a TIA is that it must handle both low and high input power levels.

To operate over such a wide input signal power range, prior art systems use multiple servo loops. Thus, both the DC operating conditions and the transimpedance gain are controlled by at least one servo loop. As a result, prior art systems utilize multiple servo loops to maintain in the TIA up to its output a low signal distortion and reasonable DC operating conditions. In addition, the TIA also must convert the single-ended input into a differential output. To meet system specifications, multiple servo loops, which operate in parallel, must be used resulting in complex designs and long settling times incompatible with optical line terminals (OLT) TIAs.

At least two but usually three loops are implemented in TIA control systems. In a select few situations, such as in the case of OLT TIAs, the number of loops is reduced to one using fixed parameters such that a small transimpedance gain with no AGC, replicas, etc. are allowed. However, this arrangement suffers from several drawbacks. One drawback is that in a single servo control loop the three variables: DC operating conditions, transimpedance gain and single-ended to differential conversion, are not optimal over the full optical power range. As a result, the system has significant performance loss at low and/or high optical power.

As a part of these servo control loops there is often a DC restore circuit, which is best described as a current mirror circuit, that absorbs a portion of the DC input current coming from the photodiode. A problem is, in intermediate optical power region where the mechanism gets engaged, as the current in the current mirror is small, the circuit suffers from high slewing delays that are not compatible with fast settling time OLT TIAs.

Therefore, there is a need in the art for a fast-settling amplifier output level control system that provides low signal distortion, reasonable DC operating conditions and overcomes these drawbacks of the prior art.

SUMMARY

To overcome the drawbacks of the prior art and provide additional benefits, a single servo control loop and amplifier for amplifier output signal control with low signal distortion and reasonable DC operating conditions is disclosed. In one embodiment it comprises an amplifier configured to receive an input signal on an amplifier input and generate an amplified signal on an amplifier output. A differential signal generator configured to receive and process the amplified signal and generate differential output signals. A single servo control loop configured to receive the differential output signal and generate a gain control signal and a current sink control signal. A gain control system configured to receive the gain control signal and, responsive thereto, control a gain of the amplifier. A current sink configured to receive the current sink control signal and, responsive thereto, draw current from the amplifier input.

The gain control system may comprise a soft-switched automatic gain control device configured to receive the amplifier input, the amplifier output, and the gain control signal. In one embodiment, the current sink comprises a fast input DC current sourcing mechanism that draws current away from the amplifier input such that the amount of current drawn away from the amplifier input is based on the current sink control signal. The differential signal generator may comprise one or more operational amplifier, at least one of which receives a control signal from the single servo control loop. The amplifier may be a transimpedance amplifier.

In one configuration, the single servo control loop comprises an integrator, one or more offset devices, and one or more control loop amplifiers. The single servo control loop may be configured to, in response to low input power levels, disabling the current sink, control the gain control system to establish the amplifier at high gain, and dynamically control the differential signal generator in response to variations in the input power. The single servo control loop may be configured to, in response to medium input power levels, disable the current sink, dynamically control the gain of the amplifier using the gain control system in response to variations in the input power, and disable the gain of the differential signal generator. The single servo control loop may be configured to, in response to high input power levels, enable the current sink to dynamically reduce input power in response to variations in the input power, control the gain control system to establish the amplifier at low gain, and disable gain of the differential signal generator.

Also disclosed herein is a single servo control loop for amplifier output control that provides low signal distortion with reasonable DC operating conditions. In one embodiment, this system comprises an amplifier configured to receive an input signal on an amplifier input and generate an amplified signal on an amplifier output. A differential signal generator configured to receive and process the amplified signal and generate differential output signals. A single control loop configured to receive and process the differential output signal to generate a control signal which are provide to output control elements configured to dynamically reject or adjust the output common mode over a range of input power levels to the amplifier.

In one embodiment, the output control elements comprise a differential signal generator with amplification connected to the output of the amplifier, an automatic gain control (AGC) element connected to the amplifier, and a current sink connected to the input of the amplifier. In one configuration the single control loop is configured to, in response to low input power levels, disable the current sink, control the AGC to establish the amplifier at high gain, and dynamically control the differential signal generator in response to variations in the input power. In response to medium input power levels, the single control loop disables the current sink, dynamically controls the gain of the AGC in response to variations in the input power and disables the gain of the differential signal generator. In response to high input power levels, the single control loop enables the current sink to dynamically reduce input power in response to variations in the input power, disables the AGC to establish the amplifier at low gain, and disables the gain of the differential signal generator.

Also disclosed is a method for controlling an output of an amplifier system to reject or adjust the output common mode while providing low signal distortion and reasonable DC operating conditions over various input power levels. In one embodiment this method includes providing, as part of the amplifier system, an amplifier, a control loop monitoring changes in output common mode, and two or more output control elements which are controlled by control signals from the control loop. The following steps may occur as part of this method. Receiving an input signal having various input power levels and amplifying the input signal with the amplifier. Monitoring one or more aspects of the output of the amplifier system and, responsive to changes in the output common mode of the amplifier system, generating control signals to the two or more output power control systems. Then, responsive to the control signals, performing one or more of the following with the two or more output control elements: reducing the input current to the amplifier and adjusting the gain of the amplifier.

In one embodiment, the two or more output control systems consists of a fast input DC current sourcing device, a soft-switched AGC, and differential signal generator configured with operational amplifiers. This method may further comprise, in response to low input power levels, disabling the DC current sourcing device, controlling the soft-switched AGC to establish the amplifier at high gain, and dynamically controlling the differential signal generator in response to variations in the input power. Further, in response to medium input power levels, disabling the DC current sourcing device, dynamically controlling gain of the soft-switched AGC in response to variations in the input power, and disabling gain of the differential signal generator and, in response to high input power levels, enabling the DC current sourcing device to dynamically reduce input power in response to variations in the input power, disabling the soft-switched AGC to establish the amplifier at low gain, and disabling gain of the differential signal generator.

In one embodiment, the output of the amplifier system is a differential signal comprising an outP signal and an outN signal, and the monitoring the output of the amplifier system comprises determining the difference between the outP signal and an outN signal. The step of adjusting the gain of the amplifier comprises one or more of the control signals adjusting a resistance of a transistor in an automatic gain control device that is connected to the amplifier. It is contemplated that when the input power level exceeds a predetermined level, one or more of the output control systems draws input current away from the amplifier. In one embodiment, control system comprises a soft-switched automatic gain control device configured to receive the amplifier input, the amplifier output, and the gain control signal and control the gain of the amplifier. The current sink may comprise a fast input DC current sourcing mechanism that draws current away from the amplifier input such that the amount of current drawn away from the amplifier input is based on the current sink control signal. In one embodiment, the differential signal generator comprises one or more operational amplifier, at least one of which receives a control signal from the single servo control loop. It is contemplated that the amplifier may be a transimpedance amplifier.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
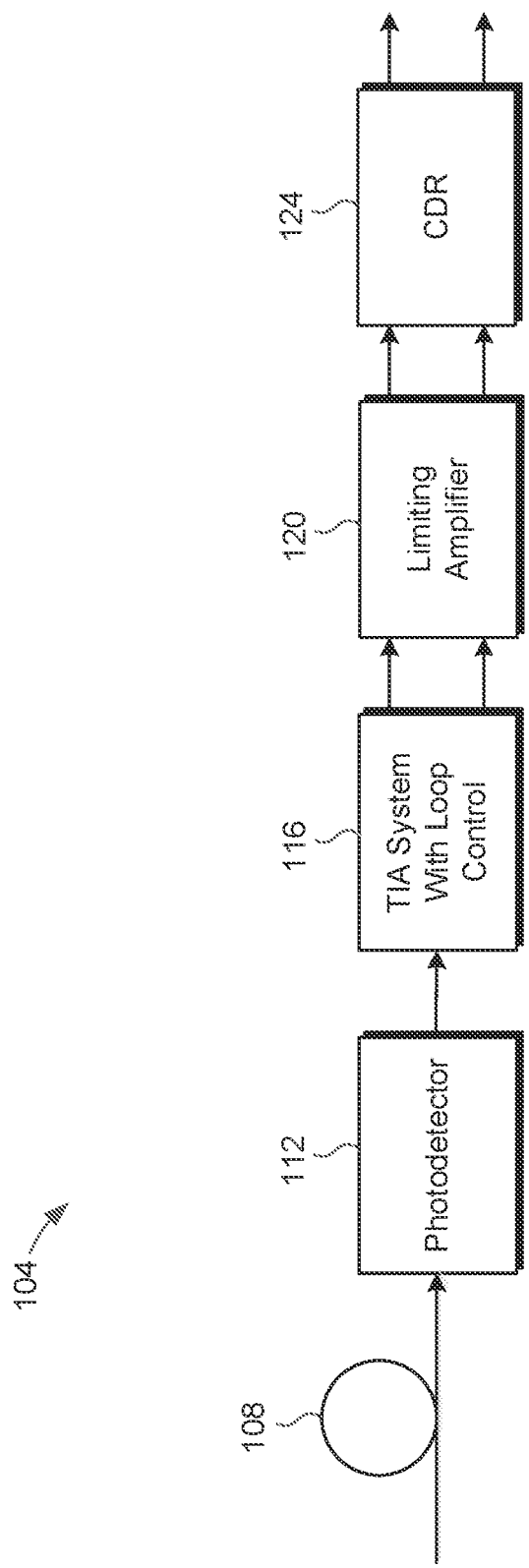
FIG. 1 illustrates an example environment of use.

FIG. 1 illustrates an example environment of use. This is but one possible environment of use and it is contemplated that this innovation may be used in any environment where adaptation occurs in response to variable power levels while also providing a fast response time. Thus, this system may be used in connection with any amplifier. In this embodiment, an optic fiber 108 caries an optic signal to a photodetector 112. The photodetector 112 converts the received optic signal to an electrical current, which is provided to a transimpedance amplifier (TIA) with loop control 116. The TIA with loop control 116 performs as described herein to amplify and convert the current output from the photodetector 112 to an amplified voltage signal. The output of the TIA with loop control 116 is provide as a differential signal to a limiting amplifier 120, which in turn outputs the amplified signal to a clock and data recovery circuit 124 that restores clock and data timing to the received signal.

Figure 2A:
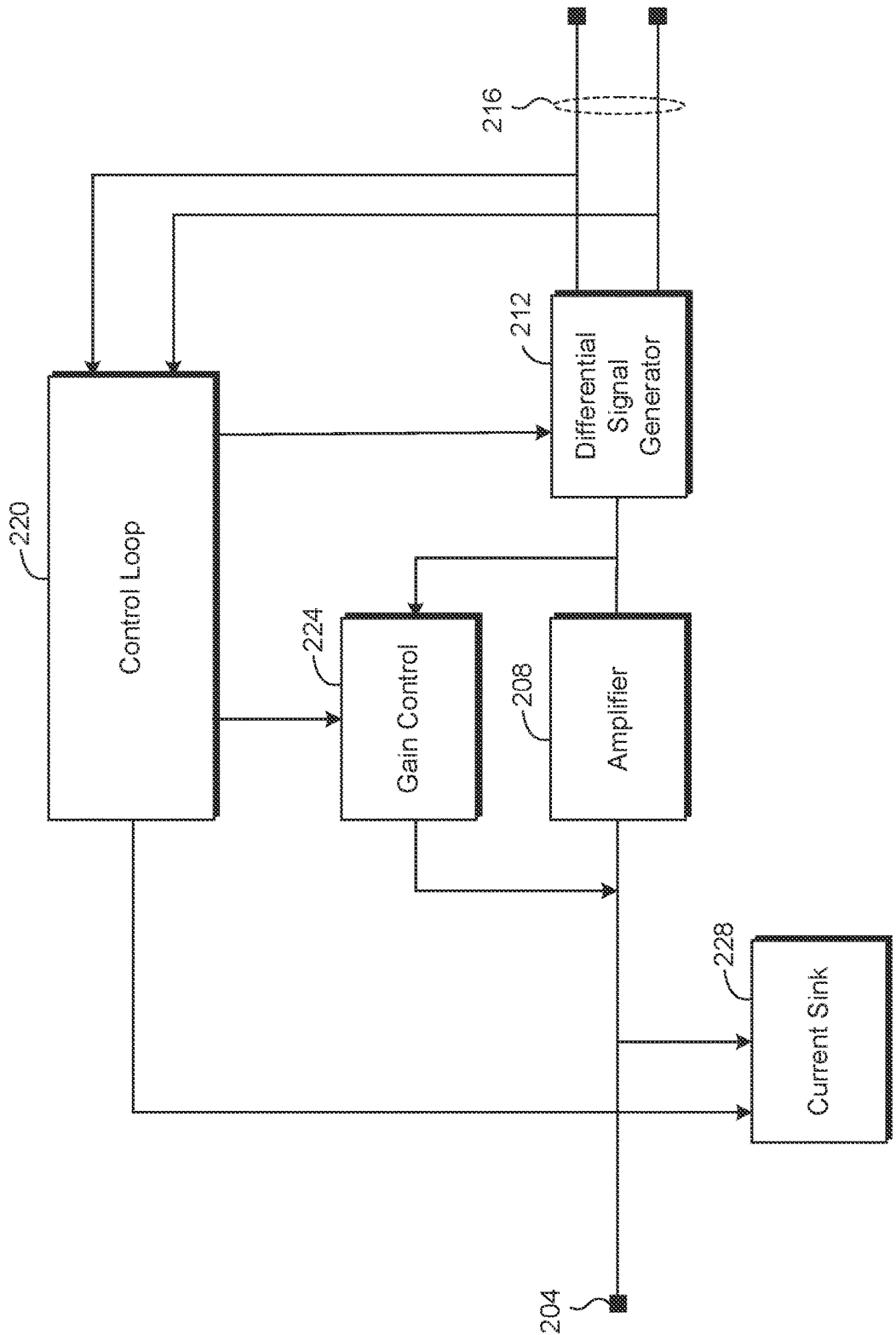
FIG. 2A illustrates a block diagram of an example embodiment of a TIA including loop control with differential signal outputs.

FIG. 2A illustrates a block diagram of an example embodiment of a TIA including single loop control with a differential signal output. This is but one possible example embodiment of a TIA with single servo loop control and as such, others may arrive at different designs. For example, different systems may be used to amplify the input signal or sink current from the input signal, and the various methods may be responsive to different voltage level/ranges, current levels/range, or power levels/ranges shown for each element.

As shown in FIG. 2A, an input 204 is configured to receive an input signal, such as the output from a photodetector. As is understood in the art, the power of the input signal will vary over time or from system to system. For example, the power of the input signal may change based on temperature, drift over time, in response to transmitting laser error, due to variation over process, fiber optic length and efficiency, or due to different transmitting lasers from system to system. Downstream processing elements are not equipped to handle a single-ended current input signal carrying the data with large power variations as is delivered by a photodetector. Thus, it is necessary to convert the single-ended current input signal into a differential voltage signal that dynamically adapt to changes in input power to reject the output common mode while maintaining low signal distortion and reasonable DC operating conditions.

The input signal from input 204 feeds into an amplifier 208, which may be any type amplifier configured to amplify an input signal. The output of the amplifier 208 connects to a differential signal generator 212, which should be considered an optional element provided when differential output is required. The output of the differential signal generator 212 is provided on differential outputs 216 as a differential signal. The output is also provided as inputs to a control loop 220 The control loop 220 processes the output signal and in response thereto, generates control signals. In this embodiment, one or more control signals are generated by the control loop 220 to reject or adjust the output common mode regardless of the input power level, as the input power level changes over time or from system to system.

One control signal generated by the control loop 220 is provided to the differential signal generator 212. This control signal is referred to as the differential signal generator control signal and the differential signal generator 212 uses this control as a reference voltage to convert the single-ended signal from the amplifier 208 into a differential signal. The differential signal generator control signal is one method use to control or adjust the output based on the input power.

Another control signal from the control loop 220 is an amplifier gain control signal, which is provided to a gain control unit 224. The gain control unit 224 constitutes a negative feedback for the amplifier 208, defining the gain of the current-to-voltage conversion and, responsive to the gain control signal, controls or adjusts the gain, and thus the output level of the amplifier 208. The amount of gain control is based on the integration of the output signal presented on outputs 216, which is proportional to the power of the input signal provided to the amplifier 208. Thus, responsive to changes in the input power, the gain control unit 224 controls the gain applied by the amplifier 208.

Another control signal from the control loop 220 is a current sink control signal provided to a current sink 228. The current sink 228 connects to the input to the amplifier and, responsive to the current sink control signal, sinks current away from the input 204, thus reducing the power level of the signal provided to the amplifier. The amount current drawn away from the input is based on the integration of the output signal presented on outputs 216, which in turn is related to the power of the input signal provided on input 204.

In variations of this embodiment, it is contemplated that one or more of these control elements 212, 224, 228 may be eliminated, or additional control elements may be added to provide further control over the gain and ability to accept inputs signals with wider input power swings. Further, each element may be replaced with other elements which perform a similar function. For example, although shown with a current sink 228, it is contemplated that any element may be utilized that draws current away from the input in response to high input power levels. It is also contemplated that the system may output a differential signal or be singled ended. It is also contemplated that these elements may be activated or deactivate in any order, or in response to any power level. The order and/or input power ranges that each element is activated and deactivated as described below is for purposes of discussion and explanation and understanding and should not be considered as being limited to these particular orders and power ranges.

Figure 2B:
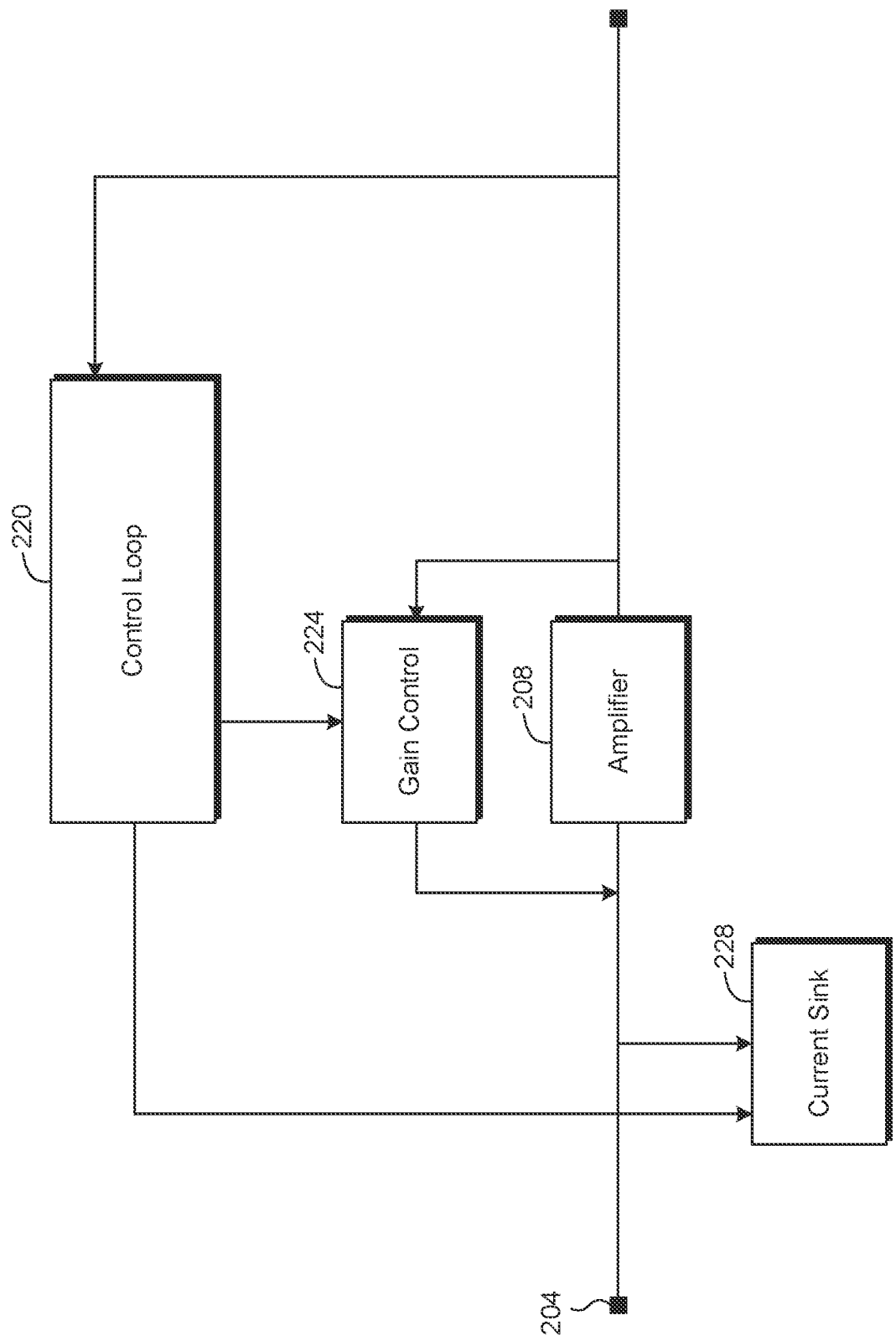
FIG. 2B illustrates a block diagram of an example embodiment of a TIA including loop control with single ended signal outputs.

FIG. 2B illustrates a block diagram of an example embodiment of a TIA with single loop control with a single-ended signal output. The elements of FIG. 2B which are similar to the elements of FIG. 2A are labeled with identical reference numbers. In this embodiment, the differential signal generator is omitted. As such, the output 230 is singled ended. The disclosed innovation can be implemented in a single ended or differential output configuration.

Figure 3:
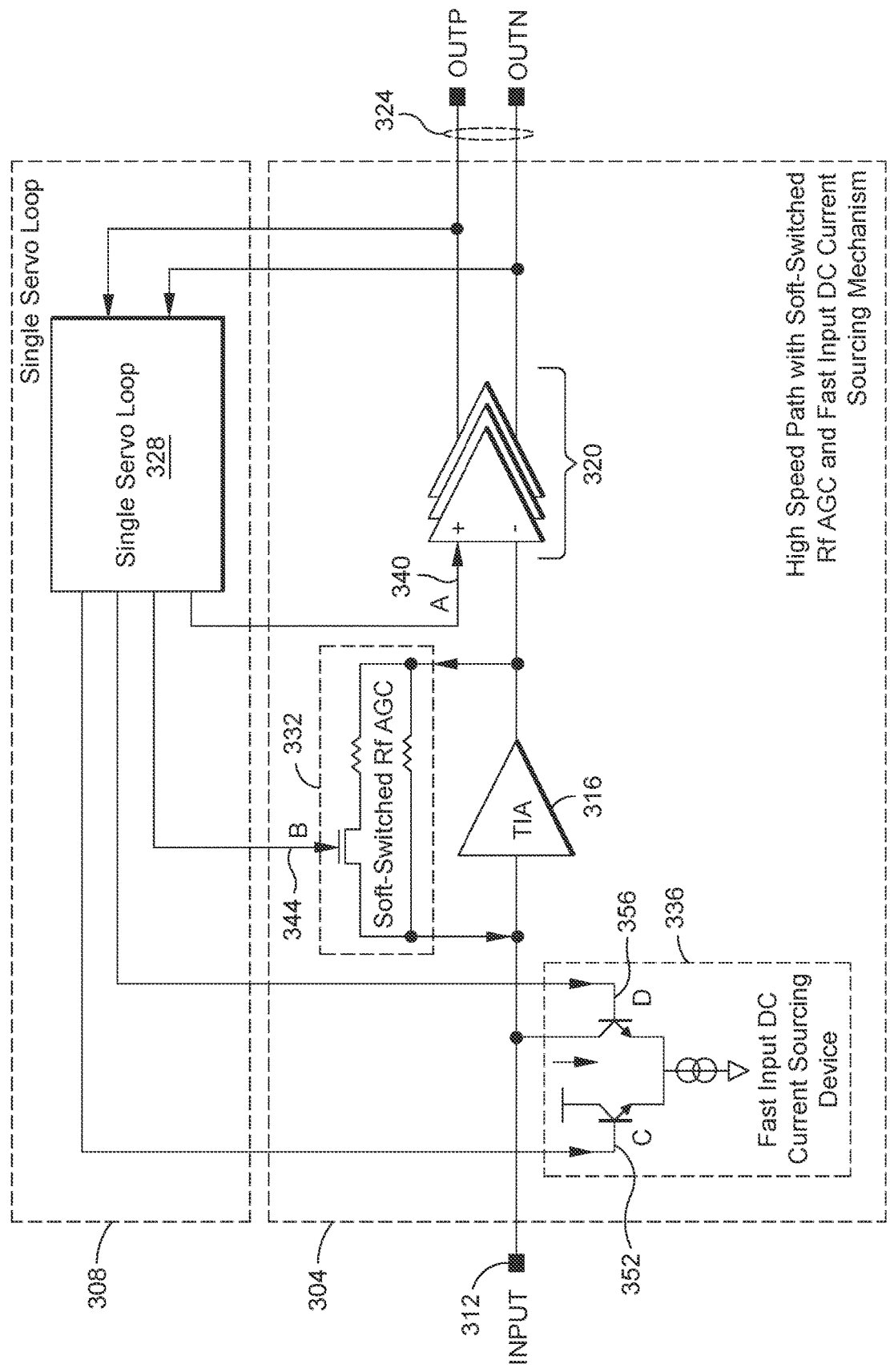
FIG. 3 illustrates an example embodiment of a TIA with single servo control loop.

FIG. 3 illustrates an example embodiment of a TIA with single servo control loop. This is but one possible implementation of a TIA and control loop. The elements of this embodiment may be divided into a high-speed path 304 and a single servo control loop 308. The high-speed path 304 is configured to quickly react to change into input power and control signal inputs. The single servo loop is a lower speed section that includes the single servo loop 328 configured to provide control signals to the high-speed path 304.

The system includes an input 312 configured to receive an input signal, such as a current signal representing a photo-detector output. This current input signal is presented to a TIA 316 for conversion to a voltage and for amplification. A DC current sourcing device 336 also connects to the input 312 as shown. The TIA 316 is a known type device and as such it is not described in detail. Associated with the TIA 316 is an automatic gain controller (AGC) 332. The AGC 332 is configured to, responsive to a control signal, adjust the gain of the TIA 316.

The output of the TIA 316 connects to a differential signal generator configured as one or more operational amplifiers 320 that are configured to convert the single ended input to a differential signal output. The one or more operational amplifiers 320 also receive a control signal input which serves as a reference voltage to the one or more operational amplifiers 320. The output of the one or more operational amplifiers 320 is presented on outputs 324 as OutP and OutN signals which are also fed back to the single servo loop 328.

The single servo loop 328 processes the OutP and OutN signals to generate control signals. The single servo loop 328 generates a control signal provided to port A 340 of the operational amplifiers 320 (differential signal generator) to dynamically control the single-ended to differential conversion based on the feedback signals provided to the single servo loop 328.

The single servo loop 328 also creates a gain control signal provided to port B 344 of the AGC 332 to control the gain of the amplifier, by controlling the ACG, based on the feedback signal provided to the single servo loop 328. In this embodiment, the AGC 332 is a soft switched device with two parallel paths, both of which contain a resistor while the upper path includes a transistor that receives the control signal as shown. The transistor acts as a variable resistor which, responsive to the control signal presented on node B, adjusts the resistance of the feedback path created by the AGC 332. The AGC 332 generates a negative feedback signal. Responsive to the control signal provided on port B 344, the gain of the AGC can be increased or decreased.

The single servo loop 328 also creates a current sourcing control signals provided to port C 352 and port D 356 of the fast input DC current sourcing device 336. These control signal enable operation of the current sourcing device 336 and controls the amount of current which is drawn away from the input 312, thus reducing the current presented to the input of the TIA 316. In operation, this reduces the input current to the TIA 316, which in turn allows to reject or adjust the output common mode on output ports 324. As discussed below in greater detail and in response to high input currents, the control signals provided to the current sourcing device 336 activate the current sourcing device to draw current away from the input. In this embodiment, the current sourcing device includes two transistors connected as shown, with both transistors connected via the emitter terminal to a current source and the collector terminal of one transistor is connected to DC voltage as shown. This arrangement provides advantages over a current mirror configuration which is too slow for the fast-settling requirements of optical line terminals (OLT) TIAs.

Figure 4:
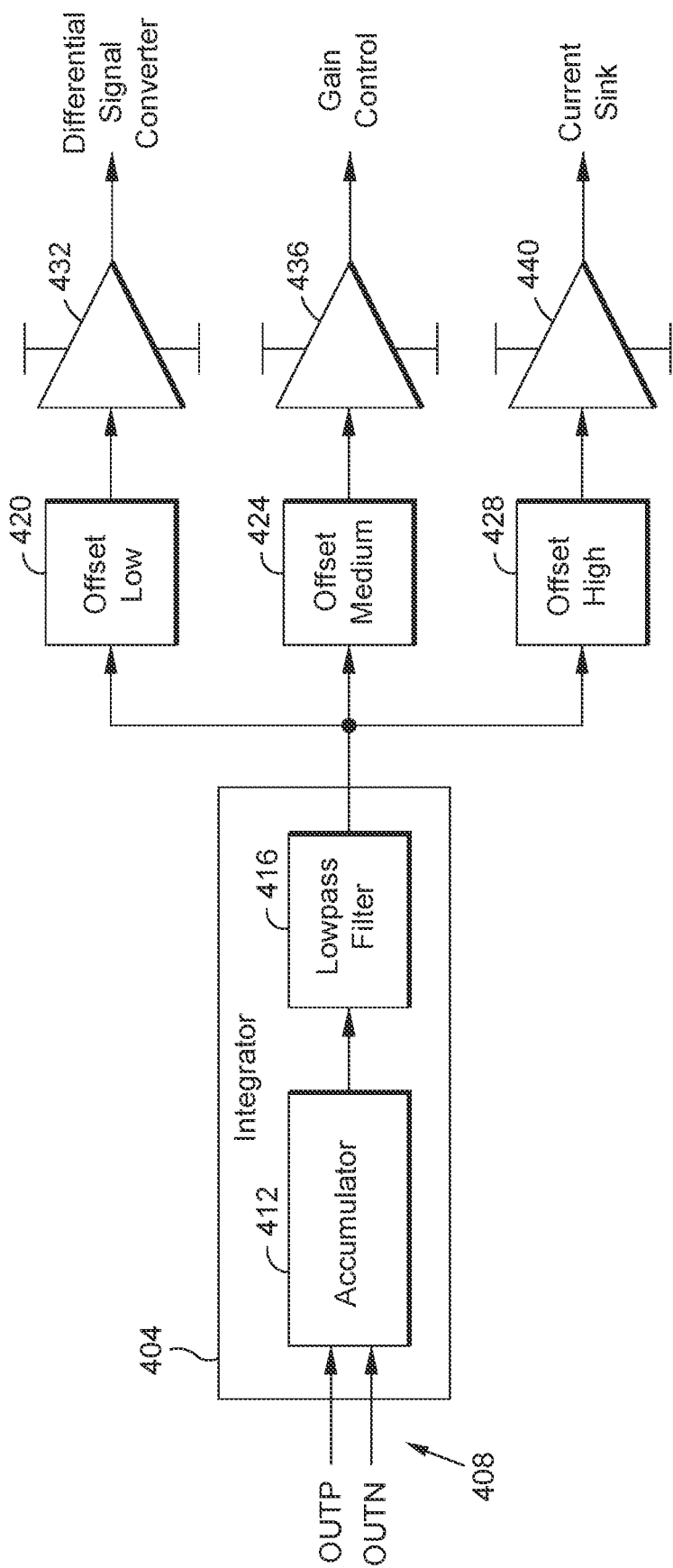
FIG. 4 illustrates an example embodiment of the single servo loop shown in FIG. 3.
Figure 5:
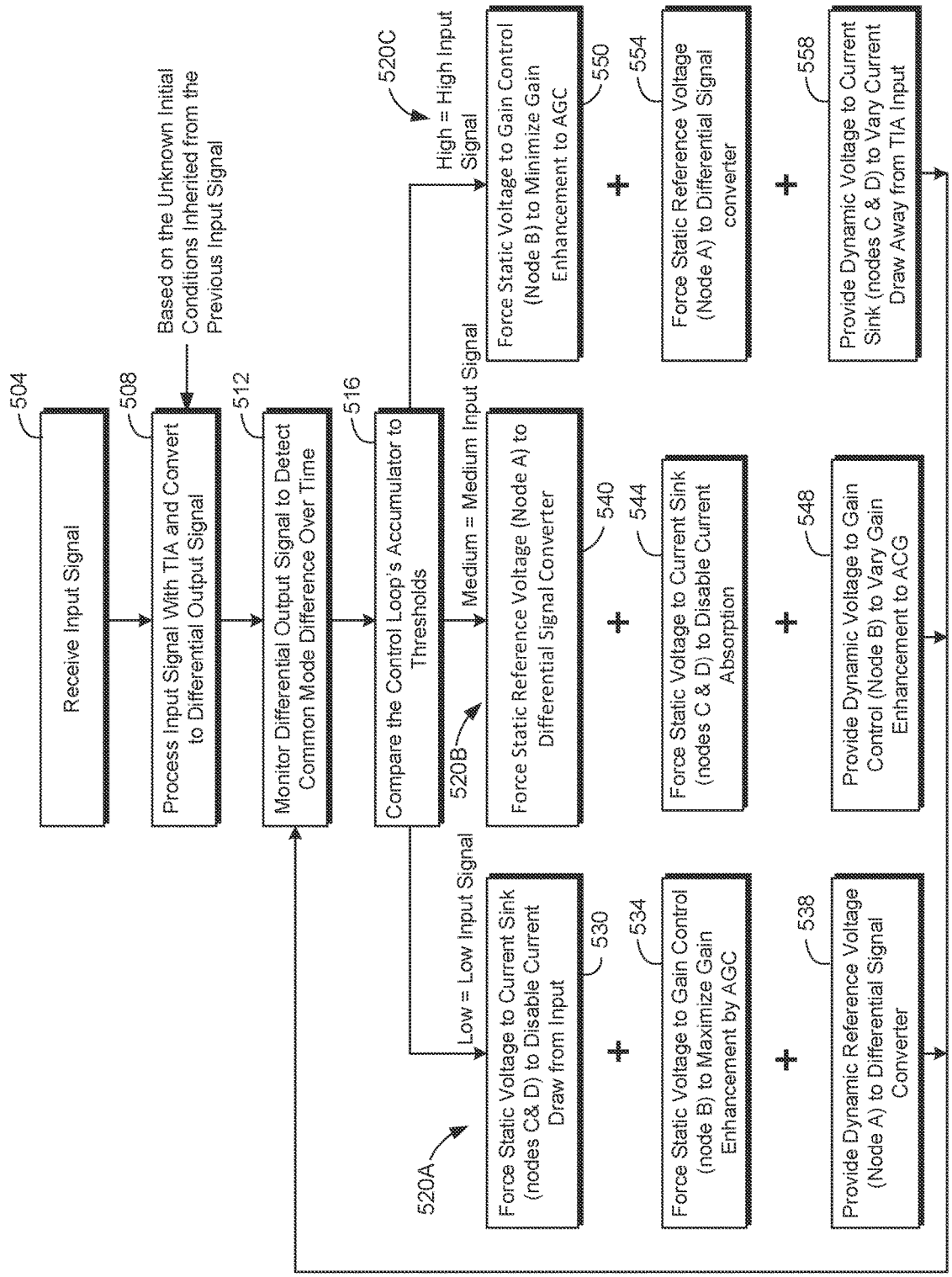
FIG. 5 illustrates an operational flow diagram of an example method of operation.

Operation of the embodiments of FIG. 2A and FIG. 4 is described in detail in FIG. 5. In general, as the input current increases, the increase is reflected at the integration of the outputs 324 at the output of the integrator 404 in the single servo loop 328. In particular, as the input current increases, the integrated difference between the outputs common mode of outP, outN increases. Based on different input powers, which are reflected in the integration of the output signal on output 324, different control signals are generated and sent to the operational amplifiers 320, the AGC 332, and the current sourcing device 336. For example, at a low input current range, the AGC 332 and current sourcing device 336 are essentially off, while the operational amplifiers converts the single-ended signal from the TIA 316 into a differential signal 324. As the input signal increases to a middle or medium range, the operational amplifiers are controlled to have a fixed reference voltage and the current sourcing device 336 is essentially off while the control signal provided to the AGC dynamically adjusts the amount of gain provided by the TIA. Thereaner as the input signal increases to be within high range, then low amplification is needed, and current is drawn away from the input by the current sourcing device 336. In this manner and through selective and variation of the control signal provided to the elements 320, 332, 336 the output signal is maintained with a rejected or adjusted output common mode with low signal distortion and reasonable DC operating conditions even in response to large variations of the input signal power level, such as a current.

FIG. 4 illustrates an example embodiment of the single servo loop shown in FIG. 3. This is but one possible embodiment of the control loop. As shown, the OutP and OutN from the TIA or differential signal generator (shown in FIG. 2A) are provided as inputs 408 to the single servo loop. The OutP and OutN differential signals are provided to an integrator 404. In this embodiment the integrator 404 comprises an accumulator 412 and a low pass filter 416. The integrator accumulates the error induced by different common modes of the OutP signal and the OutN signal to generate an output voltage. This is a known mathematical function and is not described in detail. In other embodiments, devices other than an integrator may be used to monitor and track the change in output common mode or error between two or more signals. Thus, this system is not limited to use of an integrator. For example, a counter may be used, or a software based monitoring system may be implemented.

The output of the integrator 404 is a voltage that is provided to a low offset 420, a medium offset 424, and a high offset 428 as shown. In one embodiment, the offsets 420, 424, and 428 comprise resistive ladders or resistive networks that are configured to generate an output voltage that can be either higher or lower than the input voltage. It is contemplated that each offset 420, 424, 428 will provide a different higher or lower voltage. Thus, in one embodiment, responsive to a low voltage input to the offsets, the offset low will output a high voltage and the offsets medium and high will output a low voltage, responsive to a medium voltage input to the offsets, the offsets low and medium will output a high voltage and the offset high will output a low voltage, and responsive to a high voltage input to the offsets, all three offsets will output a high voltage. The voltages output from each offset, or an amplified version thereof, serve as control signals.

The output of the offset low 420 feeds into a differential pair amplifier 432, the output of which connects to the differential signal converter 320 shown in FIG. 3. The output of the offset medium 420 feeds into a differential pair amplifier 436, the output of which connects to the AGC 332 shown in FIG. 3 to function as a gain control signal. The output of the offset high 420 feeds into the differential pair amplifier 440, the output of which connects to the current sink 336 shown in FIG. 3. Although shown as a differential pair amplifiers 432, 436, 440, it is contemplated that other type elements or amplifier may be used.

In operation, the OutP and OutN signals are provided to the integrator 404 which generates an output that is the integration of the difference between OutP and OutN signals, which can be mapped to the input current from the photodiode, which varies with changes in optical input power or other factors. The resulting output from the integrator 404 is presented to the offsets 420, 424, 428. For a given input, each offset 420, 424, 428 generates and outputs a different voltage level. The output of each offset 420, 424, 428 controls operation of each amplifier 432, 436, 440 such that each amplifier will be in one of three modes of operation. The three modes of operation are saturated off, variable gain mode, or saturated full on.

Operation is next described in relation to three different input power (voltage) levels provided to the integrator 404. These levels are generally described as low voltage level, medium voltage level, and high voltage level. These levels should be considered to be a range of voltages that the signal may vary over such that a threshold voltage level exists between two voltage levels where the system will transition into another mode of operation.

In response to a low input current, a low voltage comes out of the integrator 404, and is provided to each offset 420, 424, 428. In response to a low voltage level or low voltage range, the offset low 420 outputs a voltage in the low to high range that causes the differential amplifier 432 to apply an output signal that varies with voltage. Thus, the differential amplifier is not saturated fully on or saturated fully off, but instead is in linear amplification mode. At the same time, the low voltage provided to the offset medium 424 and the offset high 428 causes the differential amplifier 436 and 440 to be fully off. Differential amplifier 436 being fully off results in maximum gain by the AGC.

In response to a medium input current, a medium voltage comes out of the integrator 404, and is provided to each offset 420, 424, 428. In response to a medium voltage level or a medium range, the offset low outputs a voltage that causes the differential amplifier 432 to become fully saturated on, thus maximizing its output. However, the offset medium 424 outputs a voltage that causes the differential amplifier 436 to be in linear amplification mode and provide a variable output signal to the AGC, which reduces amplifier 316 gain as the input power increases. At the same time, the medium voltage level provided to the high offset 428 is not sufficient to cause the high offset 428 output to turn on the current sink 336, and as result it remains fully off.

In response to a high input current, a high voltage comes out of the integrator 404, and is provided to each offset 420, 424, 428. In response to a high voltage level or a high range, the offset low outputs a voltage that maintains the differential amplifier 432 to stay fully saturated on, thus minimizing its output. The offset medium 424 outputs a voltage that causes the differential amplifier 436 to move into fully saturated on mode, thus maximizing its output provided to the AGC 332 (which minimizes gain). At the same time, the offset high 428 outputs a voltage that causes the differential amplifier 440 to be in linear amplification mode. This in turn cases the current sink 336 to pull current away from the TIA input. If the input voltage to the offset high is at a maximum level, then the differential amplifier 440 is fully saturated on.

FIG. 5 illustrates an operational flow diagram of an example method of operation. This is but one possible method of operation and, aner reading the specification, one of ordinary skill in the art may determine other methods of operation which do not depart from the claims. At a step 504 the system receives an input signal. The input signal may be a current from a photodetector such that the current may vary widely from application to application, or over time. At a step 508 the TIA processes the input signal to create an amplified voltage and this amplified voltage is converted to a differential output signal.

At a step 512, the single servo loop monitors the differential output signal to capture the common mode difference over time, i.e., low-frequency difference between outP and outN. As discussed above, the integrator performs this function. The resulting integrated signal, often referred to as an accumulated signal, is compared, at a step 516, to one or more threshold values to determine whether the input signal to the TIA is in a low input signal range, a medium input signal range, or a high input signal range. The threshold values may be a first threshold value that delineates the low input signal range from the medium input signal range, and a second threshold value that delineates the medium input signal range from the high input signal range. In other embodiments, a threshold comparison is replaced by the resistor ladder offsets which, when combined with the tri-states differential amplifiers, function as described above to selectively generate control signals responsive to the magnitude of the integrator output.

From step 516, based on which voltage range the input to the loop controller falls in, the operation will progress down one of the three paths 520A, 520B, 520C. For example, if the input to the loop controller is in the low voltage range, then operation continues in path 520A. If the input to the loop controller is in the medium voltage range, then operation continues in path 520B, while if the input to the loop controller is in the high voltage range, then operation continues in path 520C. The innovation described herein is not limited to particular numeric voltage ranges or input powers for operation in each of the low voltage range, medium voltage range, and high voltage range. It is also disclosed that a greater or fewer number of ranges may be used. For example, in some systems there may be only a low range and a high range, or in other embodiments there may more than three ranges.

If the input to the loop controller is in the low range, then the operation advances to step 530, step 534, and step 538. All of these steps may occur concurrently or in a stepwise manner. At a step 530, the loop control provides a control signal to nodes C & D of the current sink to disable the current sink from drawing current away from the input node of the TIA. Thus, no current is drawn away from the TIA input due to the input current to the TIA already being in the low range. At a step 534, the loop controller forces a static voltage at node B of the gain controller to maximize gain enhancement by the AGC. Thus, due to the low voltage range of the input signal to the loop controller, the input to the TIA is likewise low and the gain of the AGC is set to maximum gain. At a step 538, the loop controller provides a dynamic reference voltage to node A of the differential signal converter. The dynamic reference voltage varies with variations in the input current to the TIA and thus will adjust itself up and down to control the single-ended to differential conversion during the time that there is low input currents to the TIA.

After steps 530, 534, 538, the operation returns to step 512 and the system continues to monitor the differential output signal to detect any common mode differences over time. A comparison occurs as described above at step 516 to compare the voltage input to the loop controller to the thresholds.

For purposes of discussion, if the level presented to the loop controller advances from the low range to the medium range, then the operation advances to path 520B. In path 520B, at a step 540 the loop controller forces a static reference voltage to node A of the differential signal converter. The loop controller, at step 544 forces a static voltage to nodes C and D of the current sink. This results in the current sink not drawing any current away from the input to the TIA. At step 548, the loop controller provides a dynamic voltage to node B of the gain controller to vary gain enhancement of the AGC. The dynamic voltage (AGC control signal) to node B changes over time based on the input current to the TIA, and in response thereto adjusts the amplifier gain to the TIA to maintain low signal distortion and reasonable DC operating conditions. After steps 540, 544, 548 occur the operation returns to step 512. Steps 540, 544, 548 may occur concurrently, or in any order.

For purposes of discussion, if the level presented to the loop controller advances from the medium range to the high range, then the operation advances to path 520C. In path 520C, at a step 550 the loop controller forces a static reference voltage to node B to minimize gain enhancement of the ACG. Thus, as the input signal increases, the AGC controls the TIA to provide less gain. The loop controller, at step 554 forces a static reference voltage to node A of the differential signal converter. At step 558, the loop controller provides a dynamic voltage to nodes C and D of the current sink to cause the current sink to draw current away from the TIA input. The feedback nature of the loop causes the amount of current drawn through the current sink to be proportional or related to the magnitude of the input current. The dynamic control voltage to node C and D changes over time based on the input current to the TIA to maintain low distortion and reasonable DC operating conditions. After steps 550, 554, 558 occur, the operation returns to step 512. Steps 550, 554, 558 may occur concurrently, or in any order.

The following table describes operation of the three primary elements, differential signal converter 320, AGC 332, and current sink 336, at different power ranges. These three elements, based on dynamic control signals from the single servo loop controller 328 are enabled or disabled based on the input power to the TIA, as detected by the feedback loop to establish the amplifiers 320, AGC 332 and current sink 336 as fully on, fully off, or dynamically (variable) controlled to provide a variably increase or decrease in the overall system gain.

| Input Power To TIA | Status of Diff. Signal Converter | Status of AGC | Status of DC Current Sink (Source) |
| --- | --- | --- | --- |
| Low Range | Linear Operation to provide dynamic reference voltage used for single-ended to differential conversion | Fully Off - Max. Gain by AGC | Fully Off - No Current Draw |
| Medium Range | Fully On - Min. Reference Voltage | Linear Operation to Provide dynamic Gain that also serves to perform differential conversion | Fully Off - No Current Draw |
| High Range | Fully On - Min. Reference Voltage | Fully On - Min. Gain by AGC | Linear Operation - Current Draw Active to Reduce Input Power at the TIA input that also serves to perform differential conversion |

The disclosed system and method have numerous benefits over the prior art systems. One such benefit is the speed of operation. In prior art systems, to control the multiple gain control elements would require multiple loops. However, use of multiple loops requires that the loops operate at different speeds to prevent one loop from competing with or acting counter to the other loop. Thus, having two fast loops would create an unstable system. The disclosed innovation beneficially has one fast control loop that is configured to control multiple path elements concurrently. Further, each path control element is configured for fast operation. For example, the fast input DC current sourcing device is faster than current mirror configurations which could not operate quickly enough, such as for burst mode transmitters, due to slew delays. Further, the soft-switched AGC provides the benefit of a slow or gentle transition from on to off, and vise-versa, so as to not create severe distortions in the output signal which may appear as or create errors during decoding.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A single servo control loop and amplifier for amplifier output signal control with low signal distortion and reasonable DC operating conditions comprising:
   a transimpedance amplifier (TIA) configured to receive an input signal on a TIA an amplifier input and generate an amplified signal on a TIA amplifier output, wherein the amplified signal is single ended;
   a differential signal generator amplifier configured to receive and process the amplified signal and generate amplified differential output signals;
   a single servo control loop configured to receive the amplified differential output signal and generate a gain control signal and a current sink control signal;
   a gain control system configured to receive the gain control signal and, responsive thereto, control a gain of the amplifier; and
   a current sink configured to receive the current sink control signal and, responsive thereto, draw current from the amplifier input.

2. The single servo control loop and amplifier of claim 1 wherein the gain control system comprises a soft-switched automatic gain control device configured to receive the amplifier input, the amplifier output, and the gain control signal.

3. The single servo control loop and amplifier of claim 1 wherein the current sink comprises a fast input DC current sourcing mechanism that draws current away from the amplifier input such that an amount of current drawn away from the amplifier input is based on the current sink control signal.

4. The single servo control loop and amplifier of claim 1 wherein the differential signal generator amplifier comprises one or more operational amplifier, at least one of which receives a control signal from the single servo control loop.

5. The single servo control loop and amplifier of claim 1 wherein the single servo control loop comprises an integrator, one or more offset devices, and one or more control loop amplifiers.

6. The single servo control loop and amplifier of claim 1 wherein the single servo control loop is configured to:
   in response to low input power levels, disable the current sink with a current sink control signal, control the gain control system, with a gain control signal, to establish the amplifier at high gain, and dynamically control the differential signal generator, using a reference voltage, in response to variations in the input power, such that the input power is the input power of the input power of the input signal and the input power can be in the following power level ranges: low input power levels, medium input power levels, and high input power levels;
   in response to medium input power levels, disable the current sink, dynamically control gain of the amplifier using the gain control system in response to variations in the input power, and keep fixed the reference voltage that feeds the differential signal generator; and
   in response to high input power levels, enable the current sink to dynamically reduce input power in response to variations in the input power, control the gain control system to establish the amplifier at low gain, and keep fixed the reference voltage that feeds the differential signal generator.

7. A single servo control loop for amplifier output signal control with low signal distortion and reasonable DC operating conditions comprising:
   an amplifier configured to receive an input signal on an amplifier input and generate an amplified signal on an amplifier output, such that the amplified signal is a single ended signal;
   a differential signal generator configured to receive and process the amplified signal and generate a differential output signal;
   a single control loop configured to receive and process the differential output signal to generate one or more control signals which are provided to output power control elements configured to dynamically reject or adjust the output common mode while maintaining low signal distortion and reasonable DC operating conditions over a range of input power levels to the amplifier, wherein the output control elements comprise:
      the differential signal generator with amplification, connected to the output of the amplifier;
      an automatic gain control (AGC) element connected to the amplifier; and
      a current sink connected to the input of the amplifier.

8. The single servo control loop of claim 7 wherein the single control loop is configured to:
in response to low input power levels, disabling the current sink with a current sink control signal, controlling the AGC, with a gain control circuit, to establish the amplifier at high gain, and dynamically controlling the differential signal generator, using a reference voltage, in response to variations in the input power, such that the input power is the input power of the input power of the input signal and the input power can be in the following power level ranges: low input power levels, medium input power levels, and high input power levels;
in response to medium input power levels, disabling the current sink, dynamically controlling gain of the AGC in response to variations in the input power, and keeping fixed the reference voltage that feeds the differential signal generator; and
in response to high input power levels, enabling the current sink to dynamically reduce input power in response to variations in the input power, disabling the AGC to establish the amplifier at low gain, and keeping fixed the reference voltage that feeds the differential signal generator.

9. A method for controlling an output common mode rejection or adjustment of an amplifier system over various input power levels comprising:
providing, as part of the amplifier system, an amplifier, a differential signal generator, a control loop monitoring changes in output common mode, and two or more output control elements which are controlled by control signals from the control loop;
receiving an input signal having various input power levels;
amplifying the input signal with the amplifier to create an amplified signal, wherein the amplified signal is a single ended signal;
receiving the amplified signal, from the amplifier, at the differential signal generator and generating a differential signal;
monitoring the output of the differential signal output by the differential signal generator;
responsive to changes in the output common mode of the differential signal, generating control signals to control the two or more output control elements;
responsive to the two or more control signals performing one or more of the following with the two or more output control elements:
dynamically control the single ended to differential signal conversion performed by the differential signal generator;
reducing the input current to the amplifier; and
adjusting the gain of the amplifier.

10. The method of claim 9 wherein the two or more output control elements comprises two or more of the following: a fast input DC current sourcing device, a soft-switched AGC, and differential signal generator configured with operational amplifiers.

11. The method of claim 9 wherein the two or more output control systems consists of a fast input DC current sourcing device, a soft-switched AGC, and differential signal generator configured with operational amplifiers and the method further comprises:
in response to low input power levels, disabling the DC current sourcing device with a current sink control signal, controlling the soft-switched AGC, with a gain control signal, to establish the amplifier at high gain, and dynamically controlling the differential signal generator, using a reference voltage, in response to variations in the input power, such that the input power is the input power of the input power of the input signal and the input power can be in the following power level ranges: low input power levels, medium input power levels, and high input power levels;
in response to medium input power levels, disabling the DC current sourcing device, dynamically controlling gain of the soft-switched AGC in response to variations in the input power, and keeping fixed the reference voltage that feeds the differential signal generator; and
in response to high input power levels, enabling the DC current sourcing device to dynamically reduce input power in response to variations in the input power, disabling the soft-switched AGC to establish the amplifier at low gain, and keeping fixed the reference voltage that feeds the differential signal generator.

12. The method of claim 9 wherein the output of the amplifier system is a differential signal comprising an outP signal and an outN signal, and the monitoring the output of the amplifier system comprises determining the difference in common mode between an outP and an outN signal.

13. The method of claim 9 wherein adjusting the gain of the amplifier comprises one or more of the control signals adjusting a resistance of a transistor in an automatic gain control device that is connected to the amplifier.

14. The method of claim 9 wherein when the input power level exceeds a predetermined level, one or more of the output control systems draws input current away from the amplifier.

15. The method of claim 9 wherein at least one of the two or more output control elements comprises a soft-switched automatic gain control device configured to receive the amplifier input, the amplifier output, and the gain control signal.

16. The method of claim 9 wherein the current sink comprises a fast input DC current sourcing mechanism that draws current away from the amplifier input such that an amount of current drawn away from the amplifier input is based on the current sink control signal.

17. The method of claim 9 wherein the differential signal generator comprises one or more operational amplifier, at least one of which receives a control signal from the single servo control loop.

18. The method of claim 9 wherein the amplifier is a transimpedance amplifier.

* * * * *